US008422232B2

(12) United States Patent
Kwak et al.

(10) Patent No.: US 8,422,232 B2
(45) Date of Patent: Apr. 16, 2013

(54) SYSTEM FOR CONTROLLING TEMPERATURE OF ANTENNA MODULE

(75) Inventors: Changsoo Kwak, Daejon (KR); In-Bok Yom, Daejon (KR); So-Hyeun Yun, Daejon (KR); Donghwan Shin, Daejon (KR); Ho-Jin Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 195 days.

(21) Appl. No.: 13/002,888

(22) PCT Filed: Jul. 21, 2009

(86) PCT No.: PCT/KR2009/004043

§ 371 (c)(1),
(2), (4) Date: Jan. 6, 2011

(87) PCT Pub. No.: WO2010/018934

PCT Pub. Date: Feb. 18, 2010

(65) Prior Publication Data

US 2011/0116230 A1 May 19, 2011

(30) Foreign Application Priority Data

Aug. 13, 2008 (KR) ........................ 10-2008-0079647

(51) Int. Cl.
*H05K 7/20* (2006.01)

(52) U.S. Cl.
USPC ....... 361/710; 361/679.49; 361/709; 343/872

(58) Field of Classification Search .................. 361/676, 361/679.46–679.47, 679.49, 679.51–679.54, 361/688–704, 707, 710
See application file for complete search history.

(56) References Cited

U.S. PATENT DOCUMENTS

| | | | | |
|---|---|---|---|---|
| 5,684,493 | A * | 11/1997 | Floyd et al. | 343/709 |
| 6,094,929 | A * | 8/2000 | Eriksson | 62/259.2 |
| 6,256,198 | B1 * | 7/2001 | Larsson et al. | 361/695 |
| 7,813,111 | B2 * | 10/2010 | Anderson et al. | 361/674 |
| 7,898,810 | B2 * | 3/2011 | Mason et al. | 361/717 |
| 8,004,844 | B2 * | 8/2011 | Kim et al. | 361/716 |
| 8,081,475 | B1 * | 12/2011 | Holley | 361/719 |
| 2007/0171614 | A1 | 7/2007 | Pedoeem et al. | |
| 2007/0253201 | A1 * | 11/2007 | Blincoe et al. | 362/294 |
| 2009/0084527 | A1 * | 4/2009 | Rummel et al. | 165/104.31 |
| 2011/0241932 | A1 * | 10/2011 | Rowe | 342/175 |

FOREIGN PATENT DOCUMENTS

| | | | |
|---|---|---|---|
| EP | 1898231 | A1 | 3/2008 |
| JP | 2002-026553 | A | 1/2002 |
| JP | 2003-158465 | A | 5/2003 |
| JP | 2003-179429 | A | 6/2003 |
| JP | 2004-193855 | A | 7/2004 |
| JP | 2007-208468 | A | 8/2007 |

* cited by examiner

*Primary Examiner* — Courtney Smith
(74) *Attorney, Agent, or Firm* — Rabin & Berdo, P.C.

(57) ABSTRACT

A system for controlling temperature of an antenna module including a heat generating module, and a radome and an underbody cover that enclose the heat generating module. The system includes: a heat collecting unit mounted on inner surface of the antenna module; a heat discharging unit mounted on outer surface of the antenna module; and a heat transfer unit for transferring heat from the heat collecting unit to the heat discharging unit.

16 Claims, 2 Drawing Sheets

SYSTEM FOR CONTROLLING TEMPERATURE OF ANTENNA MODULE

TECHNICAL FIELD

The present invention relates to a system for controlling temperature of an antenna for mobile communication; and, more particularly, to a system for controlling an antenna module including a heat generating module, a radome and an underbody cover that enclose the heat generating module.

BACKGROUND ART

Normally, antennas employ an active module, which produces heat during communication. The heat is mostly produced at a power amplifier taking part of a transmission circuit. As the power amplifier has a larger output or a lower efficiency; the power amplifier produces more heat. Especially, for a mobile satellite antenna attached to a moving object, a radome, which is a cover of the mobile satellite antenna used to protect an antenna module including the active module. The radome thermally isolates the internal part of the radome from outer condition.

The radome is normally made of fiber reinforced plastic or honeycomb panel. Since the fiber reinforced plastic has a low heat conductivity lower than 1 W/m-k, but its thickness is around 2~3 mm, it is possible to expect heat transmission to some extent. For low frequency transceiver antennas, radomes made of inexpensive fiber reinforced plastics are normally used. In case of using the honeycomb panel to form the radome, strength increase is relatively greater than the weight increase. However, since the gap between the skins of the honeycomb panel is mostly filled with air which can not transfer heat very well, and a honeycomb structure having very low thermal conductivity and a honeycomb core's small cross section connects the skins, it is hard to expect any heat transfer through the honeycomb panel.

The underbody cover which forms the base of the antenna module and is connected to the radome is normally made of the fiber reinforced plastic or metal. In case of using the fiber reinforced plastic, the underbody cover can not perform a function as a supporting structure but only as a protection cover of the antenna module. For this reason, the underbody cover does not have to be strong enough to work as a supporting structure, and this allows minimization of the thickness to expect some extent of heat discharge. In case of using the metal, the underbody cover works as a supporting structure to attach an antenna to the moving object. Since it is metal, the heat is transferred through the underbody cover relatively well.

Conventional mobile satellite antennas do not require a power amplifier to transmit signals, because they only receive the signals. Even if the conventional mobile satellite antenna transmits the signals, since the frequency band is Ku band ranging from around 12.5 to 18.0 GHz which is relatively low, the efficiency of the power amplifier is high and the energy transformed into heat is relatively small. Also in case of manufacturing dish antennas, since there is small limitation in enlarging the size of the dish antenna, it is possible to make large ones that require the power amplifier having small power output, which leads to lower energy loss. As mentioned above, since the conventional mobile satellite antennas do not generate a lot of heat, the underbody cover is made of the metal and the radome is made of the fiber reinforced plastic, heat generated inside the antenna module can be easily transferred to the environment.

Differently from the conventional antennas, recently developed mobile satellite antennas have both functions of transmitting and receiving signals. In the aspect of frequency band, antennas are manufactured to use Ka band ranging from 26.5 to 40 GHz or both Ka and Ku bands. The heat generated from Ku band power amplifier is added to the heat generated by Ka band amplifier that has a low efficiency and generate intense heat, and the total sum of heat in the antenna module becomes an immense amount.

These days, the radome and the underbody cover are all made of honeycomb panel to lighten antenna weight for mobility. In this case, antenna is enclosed by thermally isolating material and heat produced inside the antenna is not discharged outside but is accumulated in the antenna. If the internal temperature of the antenna exceeds certain specified level, it causes damage to the antenna module, which is one cause of antenna failure.

DISCLOSURE

Technical Problem

An embodiment of the present invention is directed to providing a system for controlling temperature of an antenna to maintain certain range of temperature inside the antenna, which is enclosed by a radome and an underbody cover made of insulating material, by discharging generated heat and preventing heat transfer from exterior space.

Another embodiment of the present invention is directed to providing a system for controlling temperature of an antenna that prevents damage of an antenna module and extends durability of an antenna by maximizing heat transfer from inside the antenna to the environment and cutting off heat infiltration from the environment by conduction, convection and radiation.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a system for controlling temperature of an antenna module including a heat generating module, and a radome and an underbody cover that enclose the heat generating module, the system including: a heat collecting unit mounted on inner surface of the antenna module; a heat discharging unit mounted on outer surface of the antenna module; and a heat transfer unit for transferring heat from the heat collecting unit to the heat discharging unit.

In accordance with another aspect of the present invention, there is provided a underbody cover of an antenna module including a heat generating module, the underbody cover including: a heat collecting unit mounted towards inside the antenna module; a heat discharging unit mounted towards outside the antenna module; and a heat transfer unit configured to transfer heat from the heat collecting unit to the heat discharging unit.

In accordance with another aspect of the present invention, there is provided a radome of a antenna module including a heat generating module, the radome including: a heat collecting unit mounted towards inside the antenna module; a heat discharging unit mounted towards outside of the antenna module; and a heat transfer unit for transferring heat from the heat collecting unit to the heat discharging unit.

Advantageous Effects

As mentioned above, this invention has features that certain range of temperature is maintained inside the antenna, which is enclosed by a radome and an underbody cover made of insulating material, by discharging generated heat to the environment and cutting off heat from the environment.

Also, this invention prevents damage of the antenna module and extends durability of the antenna by maximizing heat transfer from inside the antenna to outer surface and cutting off heat infiltration from outer space by conduction, convection and radiation.

BEST MODE FOR THE INVENTION

The advantages, features and aspects of the invention will become apparent from the following description of the embodiments with reference to the accompanying drawings, which is set forth hereinafter.

Figure 1:
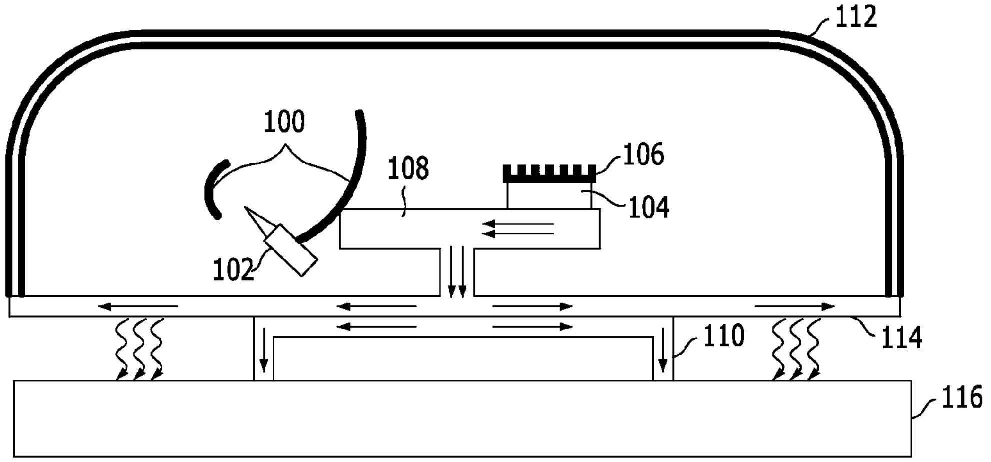
FIG. 1 (PRIOR ART)
FIG. 1 illustrates a structure of a conventional antenna module and heat discharging process thereof.

FIG. 1 illustrates a structure of a conventional antenna module and heat discharging process thereof.

In FIG. 1, an antenna module surrounded by a radome 112 and an underbody cover 114 is sustained by external supporting structure 110 and also connected to an external object 116. The external object 116 includes not only moving objects such as cars and trains, etc. but also non-moving objects. The antenna module includes an antenna reflector 100, an antenna feeding unit 102 and a heat generating module 104. The antenna reflector 100, the antenna feeding unit 102 and the heat generating module 104 are connected to the internal supporting structure 108, and the internal supporting structure 108 is connected to the underbody cover 114.

Generally the internal supporting structure 108 is made of the metal. Most of the heat generated in the heat generating module 104 is transferred to the internal supporting structure 108 by conduction. The heat transferred to the internal supporting structure 108 is transferred to the underbody cover 114 which is connected to the internal supporting structure 108. Some of the heat transferred to the underbody cover 114 is discharged through the external supporting structure 110 which is connected with the underbody cover 114. In FIG. 1, the transfer path of heat generated in the heat generating module 104 is illustrated using arrows. If the radome 112 is not made of honeycomb panel but different material, such as fiber reinforced plastic, some heat discharge through the radome is also expected.

A cooling pin 106 is attached to the heat generating module 104. Some of heat generated from the heat generating module 104 is transferred through the cooling pin 106 to the air inside the antenna module. If the radome 112 and the underbody cover 114 are made of the honeycomb panel, it is hard to expect the heat to be discharged through these elements.

As described above, the conventional systems discharge the heat generated in the heat generating module 104 mostly through the internal supporting structure 108, the underbody cover 114 and the radome 112. However, since the amount of heat generated in the heat generating module 104 has been increased recently and the radome 112 and the underbody cover 114 are manufactured using the honeycomb panel to lighten the weight of the antenna module, it is hard to discharge heat and control the temperature of the antenna module.

Figure 2:
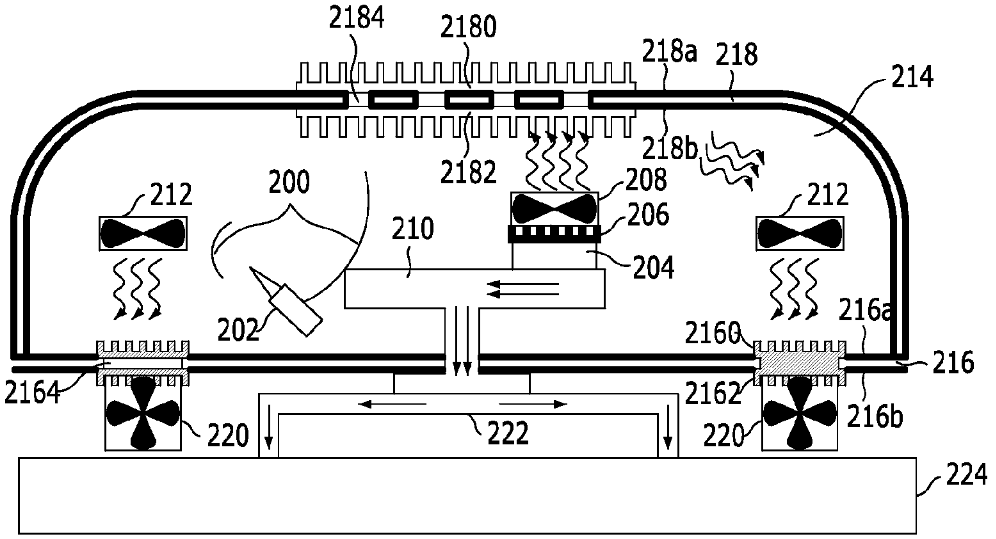
FIG. 2 illustrates a structure of an antenna module and heat discharging process thereof in accordance with an embodiment of the present invention.

FIG. 2 illustrates a structure of an antenna module and heat discharging process thereof in accordance with an embodiment of the present invention.

In FIG. 2, the antenna module enclosed by a radome 218 and an underbody cover 216 is sustained by an external supporting structure 222, and connected to an external object 224. As mentioned above, the external object may be a moving or non-moving object. The antenna module includes an antenna reflector 200, an antenna feeding unit 202 and a heat generating module 204. The antenna reflector 200, the antenna feeding unit 202 and the heat generating module 204 are connected to an internal supporting structure 210, and the internal supporting structure 210 is connected to the underbody cover 216.

The heat generated from the heat generating module 204 is transferred to the internal supporting structure 210 by conduction. The heat transferred to the internal supporting structure 210 is delivered to the external supporting structure 222, and then discharged to the outside. Material filled in the gap of elements such as thermal grease may be filled in the gap between the heat generating module 204 and the internal supporting structure 210 and the gap between the internal supporting structure 210 and the external supporting structure 222, to minimize the heat resistance. The path of heat transfer is illustrated in FIG. 2 by arrows.

Meanwhile, the heat generated from the heat generating module 204 is transferred to a cooling pin 206 by conduction. In an embodiment of this invention, a cooling fan 208 is attached to the cooling pin 206 that helps to discharge heat more quickly to the air inside the antenna module. Also, an inner air circulation fan 212 can be placed in the antenna module. The inner air circulation fan 212 makes air inside the antenna module to be circulated and helps transferring heat generated from the heat generating module 204 to heat collecting pins 2160 and 2182 which will be described below.

In this embodiment, to increase heat transfer efficiency through the underbody cover 216, the heat collecting pin 2160 can be placed on the inner surface 216*a* of the underbody cover, and a heat discharging pin 2162 can be placed on the outer surface 216*b* of the underbody cover. The heat inside the antenna is transferred to the heat collecting pin 2160 and the heat transferred to the heat collecting pin 2160 is discharged to the environment through the heat discharging pin 2162.

If the generated heat is not being discharged sufficiently through the heat collecting pin 2160 and the heat discharging pin 2162, a heat transferring unit can be placed between the heat collecting pin 2160 and the heat discharging pin 2162. In an embodiment of the present invention, a heat transfer device 2164 is used to deliver the heat from the heat collecting pin 2160 and the heat discharging pin 2162. The heat transfer device 2164 can deliver the heat from one side to the other by compulsion using electric power. By placing heat transfer device 2164 between the heat collecting pin 2160 and the heat discharging pin 2162, better heat transfer efficiency is expected. Thermoelectric device can be used for heat transferring unit and it can be turned on or off selectively according to the internal temperature automatically.

For quick heat discharge, an outer air blowing fan 220 can be placed at in front of the inner heat discharging pin 2162 in addition to discharging heat only by using the heat transfer device 2164, the heat collecting pin 2160 and the heat discharging pin 2162. By blowing certain amount of external air to the heat discharging pin 2162, the heat can be discharged more quickly. Especially, when the external object 224 to which antenna module is connected is moved, some amount of open air flows around the antenna module. However, if the external object is not moved, an outer fan 220 can let air flow around the antenna module compulsorily.

The heat discharging unit may be established on the radome 218 to discharge the heat generated from the heat generating module 204. First of all, just as the underbody cover 216, a heat collecting pin 2180 is placed on the outer surface 218*a* of the radome 214, and a heat discharging pin 2182 is placed on the inner surface 218*b* of the radome 214. The functions of the heat collecting pin 2182 and the heat discharging pin 2180 are same or similar to those of the underbody cover 216, detailed description on them will be skipped for easy description.

Figure 3:
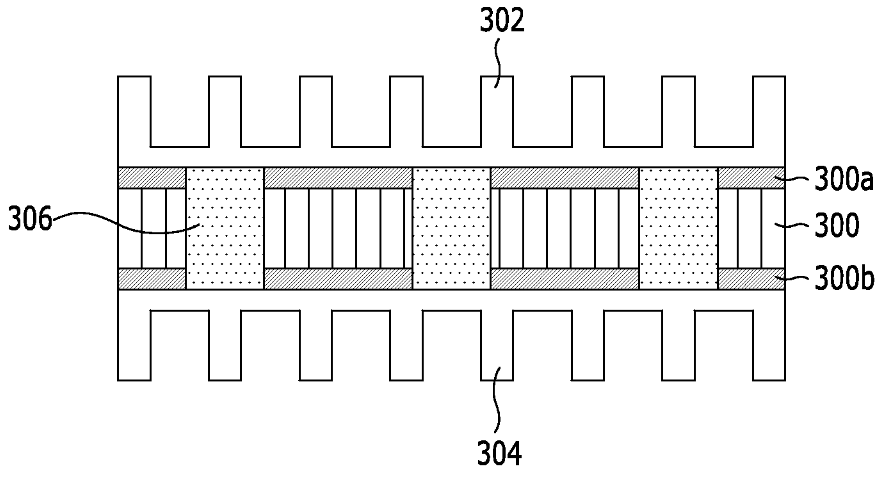
FIG. 3 illustrates a structure of a heat discharging via hole placed between a heat collecting pin and a heat discharging pin in accordance with an embodiment of the present invention.

Between the inner heat collecting pin 2182 and the heat discharging pin 2182, a heat discharging via holes 2184 can be placed. FIG. 3 shows structure of a heat discharging via hole placed between a heat collecting pin and a heat discharging pin in accordance with an embodiment of the present invention.

A heat discharging via holes 306 are thermal connecters between a heat sink and a heat generating element by forming a vertical opening in a substrate and filling the opening with thermal conductor if the substrate is made of non-thermal-conducting material, to transfer the heat generated from the heat generating element to the heat sink. As shown in FIG. 3, when a radome 300 is made of honeycomb panel, since it is difficult to transfer the heat between outside 300*a* and inside 300*b* of the radome 300, by placing the heat discharging via hole between the inner heat collecting pin 304 and the heat discharging pin 302 set in the radome, high efficient heat transfer can be expected. Various materials can be used for the heat discharging via hole 306, for example, copper may be used to form a heat discharging via hole 306 to drive maximum heat transfer efficiency with least heat discharging via holes.

In the embodiment described with reference to FIG. 2, the heat transfer device 2164 is placed in the underbody cover 216 and the heat discharging via holes 2184 are placed in the radome 218, however, positions of the heat transfer device and the heat discharging via holes are variable. That is, it is also possible to mount the heat discharging via hole 2184 in the underbody cover 216 and to mount the heat transfer device 2164 in the radome 218.

When the heat collecting pins 2160 and 2182, the heat discharging pins 2162 and 2180, the heat transfer device 2164 and the heat discharging via hole 2184 are formed at the radome 214, those positions should be selected not to disturb transmitting and receiving electromagnetic waves.

In order to absorb and discharge heat generated inside the antenna module efficiently, it is desirable to color the heat collecting pins 2160 and 2182 in black and the heat discharging pins 2162 and 2180 in white. For outer surface of the radome 214, it is desirable to color white to avoid accepting thermal radiation from the sun as much as possible.

According to the embodiment of this invention, there is a merit maintaining temperature inside the antenna within a required range by discharging the heat generated inside the antenna module enclosed by the radome and the underbody cover which are made of adiabatic material and cut off heat from outer environment.

Also, the embodiment of this invention maximizes heat transfer from inside the antenna to outside by heat conduction, convection and radiation, and prevent heat from being transferred from outside to inside of the antenna, so as to avoid damage of the antenna module and guarantee antenna durability.

The present application contains subject matter related to Korean Patent Application No. 2008-0079647, filed in the Korean Intellectual Property Office on Aug. 13, 2008, the entire contents of which is incorporated herein by reference.

While the present invention has been described with respect to the specific embodiments, it will be apparent to those skilled in the art that various changes and modifications may be made without departing from the spirit and scope of the invention as defined in the following claims.

What is claimed is:

1. A system for controlling temperature of an antenna module including a heat generating module, and a radome and an underbody cover that enclose the heat generating module, the system comprising:

a heat collecting unit mounted on inner surface of the radome and the underbody cover towards inside the antenna module, the heat collecting unit collecting heat generated from the heat generating module;

a heat discharging unit mounted on outer surface of the radome and the underbody cover towards outside the antenna module, the heat discharging unit discharging to outside heat collected by the heat collecting unit; and a heat transfer unit mounted between the heat collecting unit and the heat discharging unit, the heat transfer unit transferring heat from the heat collecting unit to the heat discharging unit.

2. The system of claim 1, further comprising:

a cooling unit attached to the heat generating module.

3. The system of claim 1, further comprising:

an internal air circulation unit that circulates air inside the antenna module.

4. The system of claim 1, further comprising:

an outer air blowing unit that blows air to the heat discharging unit.

5. The system of claim 1, wherein the heat transfer unit is a heat transfer device.

6. The system of claim 1, wherein the heat transfer unit is a set of heat discharging via holes.

7. The system of claim 6, wherein the heat discharging via holes are formed of copper.

8. The system of claim 1, wherein a color of the heat collecting unit is black and a color of the heat discharging unit is white.

9. An underbody cover of an antenna module including a heat generating module, the underbody cover comprising:

an heat collecting unit mounted on inner surface of the underbody cover towards inside the antenna module, the heat collecting unit collecting heat generated from the heat generating module;

an heat discharging unit mounted on outer surface of the underbody cover towards outside the antenna module, the heat discharging unit discharging to outside heat collected by the heat collecting unit; and a heat transfer unit mounted between the heat collecting unit and the heat discharging unit, the heat transfer unit transferring heat from the heat collecting unit to the heat discharging unit.

10. The underbody cover of claim 9, wherein the heat transfer unit is a heat transfer device.

11. The underbody cover of claim 9, wherein the heat transfer unit is a set of heat discharging via holes.

12. The underbody cover of claim 11, wherein the heat discharging via holes are formed of copper.

13. A radome of an antenna module including a heat generating module, the radome comprising:

an heat collecting unit mounted on inner surface of the radome towards inside the antenna module, the heat collecting unit collecting heat generated from the heat generating module;

an heat discharging unit mounted on outer surface of the radome towards outside of the antenna module, the heat discharging unit discharging to outside heat collected by the heat collecting unit; and a heat transfer unit mounted between the heat collecting unit and the heat discharging unit, the heat transfer unit transferring heat from the heat collecting unit to the heat discharging unit.

14. The radome of claim 13, wherein the heat transfer unit is a heat transfer device.

15. The radome of claim 13, wherein the heat transfer unit is a set of heat discharging via holes.

16. The radome of claim 15, wherein the heat discharging via holes are formed of copper.

* * * * *